(12) United States Patent
Kawaguchi et al.

(10) Patent No.: US 8,173,264 B2
(45) Date of Patent: May 8, 2012

(54) RESIN COMPOSITION AND METAL LAMINATE PLATE

(75) Inventors: Masao Kawaguchi, Kisarazu (JP); Kiyomi Imagawa, Chiba (JP); Shuji Tahara, Ichihara (JP); Eiji Ohtsubo, Chiba (JP)

(73) Assignee: Mitsui Chemicals, Inc., Minato-Ku, Tokyo (JP)

( * ) Notice: Subject to any disclaimer, the term of this patent is extended or adjusted under 35 U.S.C. 154(b) by 909 days.

(21) Appl. No.: 12/282,602

(22) PCT Filed: Mar. 17, 2006

(86) PCT No.: PCT/JP2006/305882
§ 371 (c)(1),
(2), (4) Date: Sep. 11, 2008

(87) PCT Pub. No.: WO2007/108137
PCT Pub. Date: Sep. 27, 2007

(65) Prior Publication Data
US 2009/0075103 A1 Mar. 19, 2009

(30) Foreign Application Priority Data
Mar. 15, 2006 (JP) .................. 2006-071540

(51) Int. Cl.
*B32B 15/08* (2006.01)
(52) U.S. Cl. ......... 428/458; 524/105; 524/109; 524/111
(58) Field of Classification Search .................. 428/458; 524/105, 109, 111
See application file for complete search history.

(56) References Cited

U.S. PATENT DOCUMENTS

| | | | |
|---|---|---|---|
| 6,132,865 | A | 10/2000 | Oka et al. |
| 2004/0096679 | A1 | 5/2004 | Kodama et al. |

FOREIGN PATENT DOCUMENTS

| | | |
|---|---|---|
| JP | 6-145638 A | 5/1994 |
| JP | 6-192639 A | 7/1994 |
| JP | 11-35902 A | 2/1999 |
| JP | 2001-6437 A | 1/2001 |
| JP | 2001-007464 A | 1/2001 |
| JP | 2004-209962 A | 7/2004 |
| JP | 2006-104337 A | 4/2006 |

OTHER PUBLICATIONS

Office Action from Japanese Patent Office issued in Applicant's corresponding Japanese Patent Application No. 2005-077412 dated Sep. 7, 2010, with English translation.
PCT/ISA/210, 2005.
PCT/ISA/237, 2005.

*Primary Examiner* — Edward Cain
(74) *Attorney, Agent, or Firm* — Buchanan Ingersoll & Rooney PC

(57) ABSTRACT

A resin composition comprises a polyimide resin composition or precursor thereof obtained from an acid dianhydride component containing a compound represented by the following Formula (1) and a diamine component containing a diamine compound represented by the following Formula (2), and a bismaleimide compound represented by the following Formula (3), wherein the diamine component contains a diamine compound (a) in which m in the Formula (2) represents an integer of 0 or 1 and a diamine component (b) in which m in the Formula (2) represents an integer of 2 to 6 in a molar ratio (a:b) of from 100:0 to 50:50,

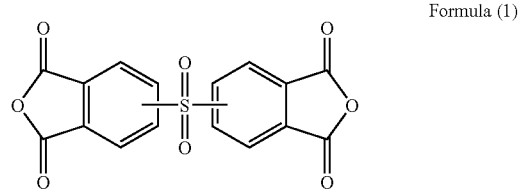

Formula (1)

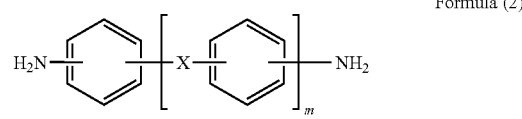

Formula (2)

wherein, in the Formula (2), when m is 2 or more, each X may be independently the same or different, and represents O, $SO_2$, S, CO, $CH_2$, $C(CH_3)_2$, $C(CF_3)_2$ or a direct bond,

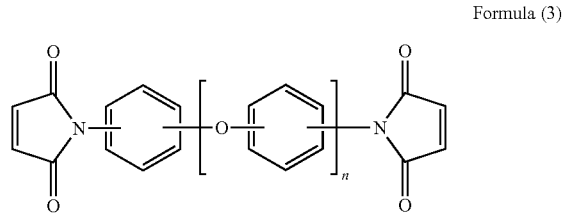

Formula (3)

wherein, in the Formula (3), n represents an integer of 0 to 6.

6 Claims, No Drawings

RESIN COMPOSITION AND METAL LAMINATE PLATE

CROSS-REFERENCE TO RELATED APPLICATION

Japanese Patent Application No. 2006-71540 is incorporated herein by reference.

TECHNICAL FIELD

The present invention relates to a novel resin composition which is used for a resin layer in a metal laminate plate or the like, and a metal laminate plate having at least one or more layers of the resin layers comprising the resin composition.

BACKGROUND ART

Polyimide has also been applied in many cases as a heat resistant adhesive used not only in the field of aerospace, but also in the field of electronics or the like requiring heat resistance from the facts that heat resistance, chemical resistance, mechanical strength, electrical characteristics and the like are excellent. Furthermore, a polyimide metal laminate plate has been used for a base material for a printed circuit board or the like, mainly as a circuit board material. In recent years, with miniaturization and high-density trend in electronic equipment, high-density trend and multilayer trend in printed circuit boards have also been attempted and a via hole for the interlayer wire connection has also been required to be not more than 50 μm. So, the via hole formation technique using a $CO_2$ laser has been increased rather than the via hole formation technique by the conventional drilling processing. There has been a problem in the via hole formation process using a $CO_2$ laser such that a polyimide type adhesive was not completely removed during $CO_2$ laser processing and remained at the bottom of the via hole as a smear and it was hard to remove such a smear even in a desmear process. Thus, polyimide type adhesives in which a smear is easily removed in a desmear process by an alkali solution or the like and which have properties such as low-temperature adhesive property and high adhesion, in addition to heat resistance, have been in demand.

As a polyimide type adhesive having sufficient heat resistance and low-temperature adhesive property, there has been developed, for example, a resin comprising a polyamic acid (a precursor of a polyimide) and/or polyimide and a specific bismaleimide compound as disclosed in JP-A2004-209962 (Patent Document 1). The resin composition disclosed in the patent document surely had low-temperature adhesive property and excellent heat resistance. However, there has been a problem such that a smear was hardly removed in a desmear process mainly by a permanganate aqueous solution or the like.

On the other hand, as a polyimide resin using a diphenylsulfone tetracarboxylic dianhydride and a specific diamine compound, there has been known a polyimide resin as described in JP-A2001-6437 (Patent Document 2) or the like. In the patent document has been disclosed a polyimide resin useful as a printed circuit board which has realized a low dielectric property. However, a specific diamine compound was used for the resin composition described in the patent document 2 so that the problem in the desmear process as described above could not be solved.

DISCLOSURE OF INVENTION

The present invention has been made in view of the circumstances and provides a resin composition comprising a polyimide resin composition or precursor thereof obtained from an acid dianhydride component containing a compound represented by the following Formula (1) and a diamine component containing a diamine compound represented by the following Formula (2), and a bismaleimide compound represented by the following Formula (3), wherein the diamine component contains a diamine compound (a) in which m in the Formula (2) represents an integer of 0 or 1 and a diamine component (b) in which m in the Formula (2) represents an integer of 2 to 6 in the molar ratio (a:b) of from 100:0 to 50:50, Formula (1)

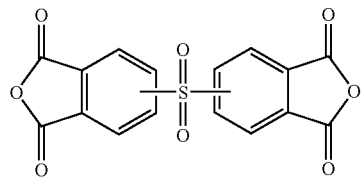

Formula (2)

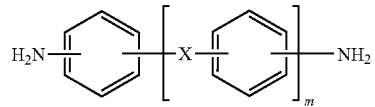

wherein, in the Formula (2), when m is 2 or more, each X may be independently the same or different, and represents O, $SO_2$, S, CO, $CH_2$, $C(CH_3)_2$, $C(CF_3)_2$ or a direct bond, Formula (3)

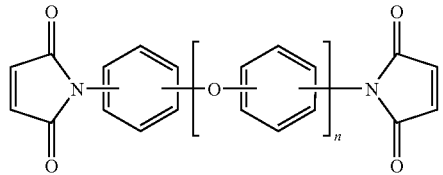

wherein, in the Formula (3), n represents an integer of 0 to 6.

An object of the present invention is to provide, for a polyimide type adhesive in a resin metal laminate plate, a resin composition which is excellent in low-temperature adhesive property, resistance to soldering heat and high adhesion, and in which a smear is easily removed in a desmear process by a permanganate aqueous solution or the like, and a metal resin laminate plate using the resin.

BEST MODE FOR CARRYING OUT INVENTION

The present inventors have conducted a study and as a result, found that polyimide produced by using a specific acid dianhydride and a specific diamine component and/or a polyimide precursor are combined with a bismaleimide compound having a specific skeleton to obtain a resin composition, and the resin composition could solve the above object.

The present invention will be described in more detail below.

The present invention relates to a resin composition comprising a polyimide resin composition or precursor thereof obtained from an acid dianhydride component containing a compound represented by the following Formula (1) and a diamine component containing a diamine compound represented by the following Formula (2), and a bismaleimide compound represented by the following Formula (3), wherein the diamine component contains a diamine compound (a) in which m in the Formula (2) represents an integer of 0 or 1 and a diamine component (b) in which m in the Formula (2) represents an integer of 2 to 6 in the molar ratio (a:b) of from 100:0 to 50:50, and a metal laminate plate having at least one layer of the resin comprising the resin composition, Formula (1)

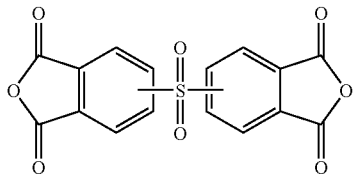

Formula (2)

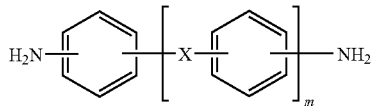

wherein, in the Formula (2), when m is 2 or more, each X may be independently the same or different, and represents O, $SO_2$, S, CO, $CH_2$, $C(CH_3)_2$, $C(CF_3)_2$ or a direct bond, Formula (3)

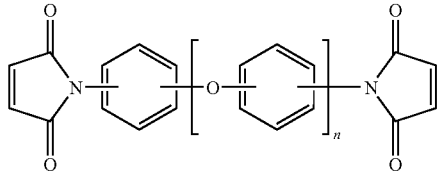

wherein, in the Formula (3), n represents an integer of 0 to 6.

In the present invention, the polyimide resin composition or precursor thereof is obtained from an acid dianhydride component containing a compound represented by the Formula (1), and a diamine component containing diamine compounds (a) and (b) represented by the Formula (2) as described below.

The compound (acid dianhydride) represented by the Formula (1) is a compound which is called the diphenylsulfone tetracarboxylic dianhydride. Such a compound is not particularly restricted as far as it can be represented by the aforementioned structural formula. Any substituted position thereof can be used.

In the present invention, the content of the acid dianhydride represented by the Formula (1) in the total acid dianhydride components is not particularly restricted as far as the acid dianhydride contains a compound represented by the Formula (1). However, as a molar ratio thereof, it is preferably from 10 to 100%, more preferably not less than 25%, further preferably not less than 50%, and much further preferably not less than 70%.

In the present invention, an acid dianhydride which can be used together with the acid dianhydride component, in addition to the acid dianhydride represented by the Formula (1), is not particularly restricted in the ranges in which the effect of the present invention is not reduced and known acid dianhydrides can be used. Desirable examples include 3,3',4,4'-benzophenone tetracarboxylic dianhydride, pyromellitic dianhydride, 4,4'-oxydiphthalic dianhydride, 3,3',4,4'-biphenyl tetracarboxylic dianhydride, ethylene glycol bistrimellitic anhydride, 1,4'-bistrimellitic anhydride hydroquinone and the like. When 3,3',4,4'-benzophenone tetracarboxylic dianhydride is used together with the acid dianhydride represented by the Formula (1), the proportion of 3,3',4,4'-benzophenone tetracarboxylic dianhydride in the total acid dianhydrides is from 1 to 50%, more preferably from 3 to 40% and further preferably from 5 to 25%. Such proportions are preferable since it is possible to improve heat resistance while keeping low-temperature adhesive property. The acid dianhydrides as cited above can also be used in combination of a plurality of kinds at the same time along with the acid dianhydride represented by the Formula (1).

The diamine component in the present invention contained in the resin composition of the present invention is a diamine compound represented by the Formula (2), wherein the molar ratio (a:b) of a diamine compound (a) in which m in the formula represents an integer of 0 or 1 to a diamine compound (b) in which m in the formula represents an integer of 2 to 6 is not particularly restricted as far as it is from 100:0 to 50:50. In the diamine compound (a), m is preferably 1, while in the diamine compound (b), m in the formula is preferably from 2 to 4 and more preferably 2. The molar ratio of the diamine compound (a) to the diamine compound (b) is from 100:0 to 50:50 as described above, preferably from 100:0 to 60:40, more preferably from 80:20 to 60:40, further preferably from 70:30 to 60:40, and particularly preferably in the range of 65:35 to 60:40. The diamine compound (a) in which m represents an integer of 0 or 1 may be used singly or in combination of a plurality of kinds of compounds satisfying the Formula (2). Similarly, in the diamine compound (b) in which m represents an integer of 2 to 6, compounds satisfying the Formula (2) may be used singly or in combination of a plurality of kinds thereof. When a plurality of kinds of compounds are used, the total molar ratio may satisfy the scope of the present invention. When m in Formula (2) is 2 or more, each X may be independently the same or different. Moreover, X represents O, $SO_2$, S, CO, $CH_2$, $C(CH_3)_2$, $C(CF_3)_2$ or a direct bond. X is preferably O, $SO_2$, CO, and more preferably O.

Examples of the diamine compound (a) include, though not restricted to, m-phenylenediamine, o-phenylenediamine, p-phenylenediamine, 4,4'-diaminodiphenyl ether, 3,3'-diaminodiphenyl ether, 3,4'-diaminodiphenyl ether, bis(3-aminophenyl)sulfone, (3-aminophenyl)(4-aminophenyl)sulfone, bis(4-aminophenyl)sulfone, bis(3-aminophenyl)sulfide, (3-aminophenyl)(4-aminophenyl)sulfide, bis(4-aminophenyl)sulfide, 3,3'-diaminobenzophenone, 3,4'-diaminobenzophenone, 4,4'-diaminobenzophenone, 3,3'-diaminodiphenylmethane, 3,4'-diaminodiphenylmethane, 4,4'-diaminodiphenylmethane, 3,3'-diaminodiphenylpropane, 3,4'-diaminodiphenylpropane, 4,4'-diaminodiphenylpropane, bis(3-aminophenyl)hexafluoropropane, (3-aminophenyl)(4-aminophenyl)hexafluoropropane, bis(4-aminophenyl)hexafluoropropane, 3,3'-diaminobiphenyl, 3,4'-diaminobiphenyl, 4,4'-diaminobiphenyl and the like. These can be used singly or in combination of two or more kinds. Preferable examples thereof include p-phenylenediamine, 4,4'-diaminodiphenyl ether, 3,4'-diaminodiphenyl ether, bis (3-aminophenyl)sulfone, (3-aminophenyl)(4-aminophenyl) sulfone, bis(4-aminophenyl)sulfone and the like.

Examples of the diamine compound (b) include, though not restricted to, 1,3-bis(3-aminophenoxy)benzene, 1,3-bis (3-(3-aminophenoxy)aminophenoxy)benzene, bis[4-(3-aminophenoxy)phenyl]methane, bis[4-(4-aminophenoxy)phenyl]methane, 1,1-bis[4-(3-aminophenoxy)phenyl]ethane, 1,1-bis[4-(4-aminophenoxy)phenyl]ethane, 1,2-bis[4-(3-aminophenoxy)phenyl]ethane, 1,2-bis[4-(4-aminophenoxy)phenyl]ethane, 2,2-bis[4-(3-aminophenoxy)phenyl]propane, 2,2-bis[4-(4-aminophenoxy)phenyl]propane, 2,2-bis[3-(3-aminophenoxy)phenyl]-1,1,1,3,3,3-hexafluoropropane, 2,2-bis[4-(4-aminophenoxy)phenyl]-1,1,1,3,3,3-hexafluoropropane, 1,4-bis(3-aminophenoxy)benzene, 1,4'-bis(4-aminophenoxy)benzene, 4,4'-bis(3-aminophenoxy)biphenyl, 4,4'-bis(4-aminophenoxy)biphenyl, bis[4-(3-aminophenoxy)phenyl]ketone, bis[4-(4-aminophenoxy)phenyl]ketone, bis[4-(3-aminophenoxy)phenyl]sulfide, bis[4-(4-aminophenoxy)phenyl]sulfide, bis[4-(3-aminophenoxy)phenyl]sulfoxide, bis[4-(4-aminophenoxy)phenyl]sulfoxide, bis[4-(3-aminophenoxy)phenyl]sulfone, bis[4-(4-aminophenoxy)phenyl]sulfone, bis[4-(3-aminophenoxy)phenyl]ether, bis[4-(4-aminophenoxy)phenyl]ether, 1,4-bis[4-(3-aminophenoxy)benzoyl]benzene, 1,3-bis[4-(3-aminophenoxy)benzoyl]benzene, 4,4'-bis[3-(4-aminophenoxy)benzoyl]diphenylether, 4,4'-bis[3-(3-aminophenoxy)benzoyl]diphenylether, 4,4'-bis[4-(4-amino-α,α-dimethylbenzyl)phenoxy]benzophenone, 4,4'-bis[4-(4-amino-α,α-dimethylbenzyl)phenoxy]diphenylsulfone, bis[4-{4-(4-aminophenoxy)phenoxy}phenyl]sulfone, 1,4-bis[4-(4-aminophenoxy)-α,α-dimethylbenzyl]benzene, 1,3-bis[4-(4-aminophenoxy)-α,α-dimethylbenzyl]benzene, 1,3-bis(3-(4-aminophenoxy)phenoxy)benzene, 1,3-bis(3-(2-aminophenoxy)phenoxy)benzene, 1,3-bis(4-(2-aminophenoxy)phenoxy)benzene, 1,3-bis(2-(2-aminophenoxy)phenoxy)benzene, 1,3-bis(2-(3-aminophenoxy)phenoxy)benzene, 1,3-bis(2-(4-aminophenoxy)phenoxy)benzene, 1,4-bis(3-(3-aminophenoxy)phenoxy)benzene, 1,4-bis(3-(4-aminophenoxy)phenoxy)benzene, 1,4-bis(3-(2-aminophenoxy)phenoxy)benzene, 1,4-bis(4-(2-aminophenoxy)phenoxy)benzene, 1,4-bis(2-(2-aminophenoxy)phenoxy)benzene, 1,4-bis(2-(3-aminophenoxy)phenoxy)benzene, 1,4-bis(2-(4-aminophenoxy)phenoxy)benzene, 1,2-bis(3-(3-aminophenoxy)phenoxy)benzene, 1,2-bis(3-(4-aminophenoxy)phenoxy)benzene, 1,2-bis(3-(2-aminophenoxy)phenoxy)benzene, 1,2-bis(4-(4-aminophenoxy)phenoxy)benzene, 1,2-bis(4-(3-aminophenoxy)phenoxy)benzene, 1,2-bis(4-(2-aminophenoxy)phenoxy)benzene, 1,2-bis(2-(2-aminophenoxy)phenoxy)benzene, 1,2-bis(2-(3-aminophenoxy)phenoxy)benzene, 1,2-bis(2-(4-aminophenoxy)phenoxy)benzene, 1,3-bis(3-(3-aminophenoxy)phenoxy)-2-methylbenzene, 1,3-bis(3-(4-aminophenoxy)phenoxy)-4-methylbenzene, 1,3-bis(4-(3-aminophenoxy)phenoxy)-2-ethylbenzene, 1,3-bis(3-(2-aminophenoxy)phenoxy)-5-sec-butylbenzene, 1,3-bis(4-(3-aminophenoxy)phenoxy)-2,5-dimethylbenzene, 1,3-bis(4-(2-amino-6-methylphenoxy)phenoxy)benzene, 1,3-bis(2-(2-amino-6-ethylphenoxy)phenoxy)benzene, 1,3-bis(2-(3-aminophenoxy)-4-methylphenoxy)benzene, 1,3-bis(2-(4-aminophenoxy)-4-tert-butylphenoxy)benzene, 1,4-bis(3-(3-aminophenoxy)phenoxy)-2,5-di-tert-butylbenzene, 1,4-bis(3-(4-aminophenoxy)phenoxy)-2,3-dimethylbenzene, 1,4-bis(3-(2-amino-3-propylphenoxy)phenoxy)benzene, 1,2-bis(3-(3-aminophenoxy)phenoxy)-4-methylbenzene, 1,2-bis(3-(4-aminophenoxy)phenoxy)-3-n-butylbenzene and the like. These can be used singly or in combination of two or more kinds Preferable examples thereof include 1,3-bis(3-aminophenoxy)benzene, 1,3-bis(3-(3-aminophenoxy)aminophenoxy)benzene and the like.

In the present invention, when the polyimide resin composition or precursor thereof is generated, the mole ratio of the acid dianhydride component containing a compound represented by the Formula (1) to the diamine component containing diamine compounds (a) and (b) represented by the Formula (2) is preferably from 90:100 to 100:90, more preferably from 95:100 to 100:95, further preferably from 95:100 to 100:100, and much further preferably from 97:100 to 100:100.

In the bismaleimide compound represented by the Formula (3), n represents an integer of 0 to 6 and more preferably 2 to 4. The position of an ether bond between aromatic rings is not particularly restricted and any positions can be used. However, the position is preferably the meta position. Examples thereof preferably include, though not restricted to, 1,3-bis(3-maleimidephenoxy)benzene, 1,3-bis(3-(3-maleimidephenoxy)phenoxy)benzene and the like. These can be used singly or in combination of two or more kinds.

These bismaleimide compounds can be produced by a condensation reaction or a dehydration reaction with each corresponding diamine compound and maleic anhydride, for example, according to a method as described in JP-A 4-99764 or the like.

Incidentally, to produce the metal laminate plate of the present invention, the mixing ratio of the bismaleimide compound to the polyimide composition of the present invention is not particularly restricted. However, it is preferably from 1 to 80% by mass and more preferably from 1 to 50% by mass, based on the total mass of the polyamic acid that is a precursor of the polyimide. When a amount of bismaleimide compound is less than 1% by mass, an effect of improved resistance to soldering heat that is the object of the present invention may not be much exhibited in any cases. Further, when it exceeds 80% by mass, the adhesive strength of a metal foil tends to be lowered.

A mixing method of the bismaleimide compound represented by the Formula (3) is not particularly restricted. Examples thereof include, though not restricted to, (a) a method comprising adding the bismaleimide compound to the polyimide resin or the precursor solution; (b) a method comprising adding the bismaleimide compound during polymerizing the polyimide resin or the precursor solution, for example, when the diamine compound or tetracarboxylic dianhydride is introduced, or in the middle of polymerization; (c) a method comprising mixing the polyimide resin or powder of the precursor and the bismaleimide compound, all of which are solids, or the like. Furthermore, the resin precursor is dehydrated and imidized in advance to obtain a solution, and then the bismaleimide compound may be mixed thereinto.

When the resin composition of the present invention is used for a metal laminate plate, the resin composition of the present invention is used for any of resin layers forming a metal laminate plate. As the resin composition for use in a metal laminate plate, in addition to the resin composition of the present invention, for example, polyimide, polyethylene, polypropylene, polycarbonate, polyarylate, polyamide, polysulfone, polyethersulfone, polyetherketone, polyetheretherketone, polyphenylsulfide, a modified polyphenylene oxide group, polyamideimide, polyetherimide, an epoxy resin and the like can be properly combined in the ranges in which the object of the present invention is not damaged. The metal laminate plate of the present invention is composed of a resin layer comprising the aforementioned resin composition and a metal layer as essential components, whereas the aforementioned resin layer is more preferably used as an adhesive layer that comes into contact with the metal. However, between the adhesive layer and the metal layer and/or on a side of the adhesive layer that does not come into contact with the metal layer, there may exist one or more layers each of an adhesive layer comprising other resin compositions and/or a non-adhesive layer and/or a metal layer as intermediate layers. That is, a plurality of layers in any combination of the resin layer containing the resin and the metal layer may also be present. Furthermore, a resin layer formed in combination of a plurality of layers of the compounds may be provided. Further, a plurality of layers of the metal layers may also be present.

To form the resin layer, there are mentioned, though not restricted to, a method comprising processing it in the form of a film and laminating, a method including coating a resin film, a metal foil, a resin metal laminate plate or the like with a varnish and drying for laminating, or the like. As the resin film, a commercial non-thermoplastic polyimide film can also be used. Examples thereof include UPILEX (registered trademark) S, UPILEX (registered trademark) SGA, UPILEX (registered trademark) SN (products of UBE Industries, Ltd., Product names), KAPTON (registered trademark) H, KAPTON (registered trademark) V, KAPTON (registered trademark) EN (products of Du Pont-Toray Co., Ltd., Product names), APICAL (registered trademark) AH, APICAL (registered trademark) NPI, APICAL (registered trademark) NPP, APICAL (registered trademark) HP (products of Kaneka Corporation, Product names) and the like. The surface of each resin layer may also be subjected to a plasma treatment, a corona discharge treatment or the like. The thickness of each resin layer is not particularly restricted according to the object. However, it is preferably in the range of 0.1 to 300 µm, more preferably in the range of 0.2 to 100 µm, and further preferably in the range of 0.3 to 50 µm.

As the kinds of the metal layer, all known metals and alloys can be applicable. Furthermore, to form the metal layer, there are mentioned, though not restricted to, a method comprising laminating a metal foil, sputtering it, or plating it, and the like. Meanwhile, the production conditions of these methods can be applied within known conditions. As the available metal layer, there can be exemplified, for example, a treated rolled copper foil, an electrodeposited copper foil, a copper alloy foil, a stainless foil and the like. These are suitable from the viewpoints of cost, thermal conductivity, rigidity and the like. Further, the thickness of the metal layer is not restricted. However, it is preferably from 1 to 150 µm and more preferably from 2 to 25 µm. Such metal layers can be used.

To produce the metal laminate plate of the present invention, there can be exemplified, for example, a method including coating the non-thermoplastic polyimide film with a varnish containing a polyamic acid that is a precursor of the polyimide comprising the resin composition of the present invention, drying and curing the resulting material for forming a resin layer, and further thermal pressing the appropriate surface of the metal foil on the surface of the resin layer. The thickness after coating the non-thermoplastic polyimide film with the resin composition is preferably in the range of 0.1 to 100 µm, more preferably in the range of 0.2 to 20 µm, further preferably in the range of 0.3 to 5 µm, and much further preferably in the range of 0.4 to 3 µm.

EXAMPLES

The present invention is more specifically explained below with reference to examples. However, the present invention is not restricted to these Examples. Incidentally, the metal laminate plates in examples were measured and evaluated in accordance with the following methods.

Via Processability: In a metal laminate plate including a structure of a copper foil/polyimide type adhesive/polyimide film/polyimide type adhesive/copper foil, the copper foil on one side of the via processed surface was removed by etching, and then an opening having a diameter of 50 µm was opened on the polyimide surface at a $CO_2$ laser frequency of 2,000 Hz, a pulse width of 10 µs and the number of shots of 3, using a $CO_2$ laser LC-2E21B/1C manufactured by Hitachi, Ltd. Subsequently, as a desmear process, an aqueous solution of MACUDIZER 9221S 450 ml/L and MACUDIZER 9276 50 ml/L manufactured by Japan Mac Dermid Inc. was subjected to a swelling treatment at 45° C. for 1 minute; a permanganate aqueous solution of MACUDIZER 9275 50 g/L and MACUDIZER 9276 50 ml/L was subjected to a permanganate treatment at 70° C. for 5 minutes; and an aqueous solution of MACUDIZER 9279 100 ml/L and a sulfuric acid 20 ml/L was subjected to a reduction treatment at 45° C. for 5 minutes. Then, an electroless copper plating and electro-copper plating were carried out for forming a via (via hole). It was confirmed whether both sides of the metal laminate plate were electrically connected by the via using a resistor. Then, copper on the periphery of the via was completely removed by etching and it was confirmed whether polyimide remained at the polyimide opening bottom of the via as a smear using a magnifier.

Peel Strength: 90° peel adhesive strength was measured in accordance with IPC-TM-650 method, 2.4.9.

Resistance to soldering heat test: The test was carried out in accordance with IPC-TM-650 No. 2.4.13 at a soldering temperature of 300° C. and occurrence of blister was confirmed. Before the test, a sample for the test had been kept in chamber at a temperature of 85° C., at a relative humidity of 85% for 50 hours.

Further, the following are what abbreviations of solvents, diamines, acid dianhydrides, bismaleimide used in Examples stand for.

DMAc: N,N-dimethylacetamide
NMP: N-methyl-2-pyrrolidone
ODA: 3,4'-diaminodiphenyl ether
PPD: p-phenylenediamine
APB: 1,3-bis(3-aminophenoxy)benzene
APB5: 1,3-bis(3-(3-aminophenoxy)phenoxy)benzene
DAS: 4,4'-diaminophenylsulfone
DSDA: diphenylsulfone tetracarboxylic dianhydride
BTDA: 3,3',4,4'-benzophenone tetracarboxylic dianhydride
APB-BMI: 1,3-bis(3-maleimidephenoxy)benzene Example 1

Into a vessel provided with a stirrer and a nitrogen inlet tube was added 243 g of DMAc as a solvent. Thereinto were added 10.27 g of ODA and 15.00 g of APB as diamine compounds in order that the molar ratio of ODA to APB was 50:50. The resulting mixture was stirred at room temperature until it was dissolved. Then, 32.26 g of DSDA and 3.22 g of BTDA were added in order that the total acid anhydride components had the molar ratio of 0.975 based on 1 of the total diamine components and the molar ratio of DSDA to BTDA was 90:10. The resulting solution was stirred at 60° C. to obtain a polyamic acid solution with the polyamic acid content of 20% by mass. In order to have the mass ratio of APB-BMI of 20% in the solid content of the polyamic acid of varnish obtained, 15.19 g of APB-BMI was added. The resulting solution was stirred at room temperature until it was dissolved to obtain a polyamic acid solution containing a bismaleimide compound. The obtained polyamic acid solution was coated on both sides of a commercial polyimide resin film (a product of Du Pont-Toray Co., Ltd., Product name: KAPTON (registered trademark) 80EN) by a roll coater in order that the thickness thereof after drying was 3 μm, and the resulting material was heat-dried at a temperature elevation rate of 7° C./min from 50° C. to 240° C. using an air-floating dry furnace to obtain an insulating film having thermoplastic resin layers on both sides thereof.

Next, a metal foil and the insulating film were laminated on a commercial electrodeposited copper foil (a product of Furukawa Circuit Foil Co., Ltd., F1-WS 12 μm) under the conditions of a temperature of 240° C. and a pressure of 1.5 MPa using a roll laminator. Subsequently, the resulting material was subjected to an annealing treatment under a nitrogen atmosphere at a temperature of 280° C. for 4 hours using a batch type autoclave to obtain a resin metal laminate plate of 500 mm in width and 1,000 m in length. The peel strength of the obtained resin metal laminate plate was not less than 1.0 kN/m on an average when it was measured at 50 points. Furthermore, a sample was kept at a temperature of 85° C., at a relative humidity of 85% for 50 hours and then the resistance to soldering heat temperature was measured using the sample. As a result, blister did not occur at 300° C. Furthermore, electrical connection of the via was confirmed by via using a resister, and then it was confirmed whether polyimide remained at the polyimide opening bottom by etching Polyimide did not remain. The results were shown in Table 1.

Examples 2 to 19

Examples 2 to 19 were conducted in the same manner as in Example 1, except that the kind and ratio of the diamine compound, the kind and ratio of the acid anhydride, and the APB-BMI content relative to the solid content of the polyamic acid were changed to those shown in Table 1. The results were shown in Table 1.

Comparative Examples 1 to 4

Comparative Examples 1 to 4 were conducted in the same manner as in Example 1, except that the kind and ratio of the diamine compound, the kind and ratio of the acid anhydride, and the APB-BMI content relative to the solid content of the polyamic acid were changed to those shown in Table 1. The results were shown in Table 1.

Synthesis Example 1

Into a vessel provided with a stirrer and a nitrogen inlet tube were introduced 19.58 g (67 mmol) of 1,4-bis(4-aminophenoxy)benzene, 8.20 g (33 mmol) of 1,3-bis(3-aminopropyl)-1,1,3,3-tetramethyldisiloxane, 35.83 g (100 mmol) of 3,3',4,4'-diphenylsulfone tetracarboxylic dianhydride, and 300 ml of NMP at an ice temperature in order that the molar ratio of 1,4-bis(4-aminophenoxy)benzene to 1,3-bis(3-aminopropyl)-1,1,3,3-tetramethyldisiloxane was 67:33, and the resulting mixture was continuously stirred for 1 hour. Subsequently, this solution was reacted at room temperature for 2 hours for synthesizing a polyamic acid. To the obtained polyamic acid were added 50 ml of toluene and 1.0 g of p-toluene sulfonic acid, and the resulting mixture was heated at 160° C. While water azeotroped with toluene was separated with the progress of the reaction, an imidization reaction was carried out for 3 hours. Then, toluene was removed and the thus-obtained polyimide varnish was flowed into methanol, and the thus-obtained precipitate was subjected to processes such as separation, grinding, washing and drying to obtain polyimide.

Synthesis Example 2

Into a flask provided with a stirrer were introduced 36.8 g (100 mmol) of 4,4'-bis(3-aminophenoxy)biphenyl, 31.1 g (210 mmol) of phthalic anhydride and 500 ml of NMP at an ice temperature, and the resulting mixture was continuously stirred for 1 hour. Subsequently, this solution was reacted at room temperature for 2 hours for synthesizing an amide acid. 40.4 g (400 mmol) of triethylamine and 30.6 g (300 mmol) of acetic anhydride were slowly dropped to the obtained amide acid, and the resulting solution was continuously stirred at room temperature for 2 hours. The thus-obtained solution was flowed into methanol and a precipitate was filtered. The precipitate was washed with methanol and dried at 150° C. for 2 hours to obtain a bisimide type compound.

Comparative Example 5

A metal laminate plate was produced in the same manner as in Example 1, except that a resin produced by using 100 parts by mass of the polyimide resin obtained in Synthesis Example 1 and 30 parts by mass of the bisimide type compound obtained in Synthesis Example 2 was replaced with the polyamic acid solution containing a bismaleimide compound used in Example 1. The test was carried out in the same manner as in Example 1. The evaluation results thereof are indicated in Table 1.

Comparative Example 6

A metal laminate plate was produced in the same manner as in Example 1, except that a varnish obtained by sufficiently mixing and dissolving 100 parts by mass of the polyimide resin obtained in Synthesis Example 1 and a bismaleimide type compound (BMI-80, a product of K•I Chemical Industry Co., Ltd.) satisfying the following formula (4) added to tetrahydrofuran was replaced with the polyamic acid solution containing a bismaleimide compound used in Example 1. The test was carried out in the same manner as in Example 1. The evaluation results thereof are indicated in Table 1.

TABLE 1

| | Molar Ratio of Diamine Compound | | | | | Molar Ratio of Acid Dianhydride | | Bismaleimide | Mass Ratio (Part by Mass) | Via Processability | | Peel Strength | Resistance to Soldering Heat |
|---|---|---|---|---|---|---|---|---|---|---|---|---|---|
| | ODA | PPD | DAS | APB | APB5 | DSDA | BTDA | APB-BMI | | Electrical connection | Polyimide Residue | | |
| Example 1 | 50 | | | 50 | | 90 | 10 | APB-BMI | 20 | Nothing abnormal detected | none | ≧1 kN/m | Nothing abnormal detected |
| Example 2 | 60 | | | 40 | | 90 | 10 | APB-BMI | 20 | Nothing abnormal detected | none | ≧1 kN/m | Nothing abnormal detected |
| Example 3 | 60 | | | | 40 | 90 | 10 | APB-BMI | 20 | Nothing abnormal detected | none | ≧1 kN/m | Nothing abnormal detected |
| Example 4 | 80 | | | 20 | | 90 | 10 | APB-BMI | 20 | Nothing abnormal detected | none | ≧1 kN/m | Nothing abnormal detected |
| Example 5 | | 80 | | | 20 | 90 | 10 | APB-BMI | 25 | Nothing abnormal detected | none | ≧1 kN/m | Nothing abnormal detected |
| Example 6 | 100 | | | | | 90 | 10 | APB-BMI | 30 | Nothing abnormal detected | none | ≧1 kN/m | Nothing abnormal detected |
| Example 7 | | 100 | | | | 90 | 10 | APB-BMI | 20 | Nothing abnormal detected | none | ≧1 kN/m | Nothing abnormal detected |
| Example 8 | 30 | 30 | | 40 | | 90 | 10 | APB-BMI | 20 | Nothing abnormal detected | none | ≧1 kN/m | Nothing abnormal detected |
| Example 9 | 60 | | | 20 | 20 | 90 | 10 | APB-BMI | 20 | Nothing abnormal detected | none | ≧1 kN/m | Nothing abnormal detected |
| Example 10 | 30 | 30 | | 20 | 20 | 90 | 10 | APB-BMI | 20 | Nothing abnormal detected | none | ≧1 kN/m | Nothing abnormal detected |
| Example 11 | 50 | | | 50 | | 90 | 10 | APB-BMI | 20 | Nothing abnormal detected | none | ≧1 kN/m | Nothing abnormal detected |
| Example 12 | | 50 | | | 50 | 100 | 0 | APB-BMI | 20 | Nothing abnormal detected | none | ≧1 kN/m | Nothing abnormal detected |
| Example 13 | 60 | | | 40 | | 100 | 0 | APB-BMI | 20 | Nothing abnormal detected | none | ≧1 kN/m | Nothing abnormal detected |
| Example 14 | | 60 | | | 40 | 100 | 0 | APB-BMI | 20 | Nothing abnormal detected | none | ≧1 kN/m | Nothing abnormal detected |
| Example 15 | 80 | | | 20 | | 100 | 0 | APB-BMI | 20 | Nothing abnormal detected | none | ≧1 kN/m | Nothing abnormal detected |
| Example 16 | | 80 | | | 20 | 100 | 0 | APB-BMI | 20 | Nothing abnormal detected | none | ≧1 kN/m | Nothing abnormal detected |
| Example 17 | 100 | | | | | 100 | 0 | APB-BMI | 25 | Nothing abnormal detected | none | ≧1 kN/m | Nothing abnormal detected |
| Example 18 | | 100 | | | | 100 | 0 | APB-BMI | 30 | Nothing abnormal detected | none | ≧1 kN/m | Nothing abnormal detected |
| Example 19 | | | 60 | 40 | | 100 | 0 | APB-BMI | 20 | Nothing abnormal detected | none | ≧1 kN/m | Nothing abnormal detected |
| Comparative Example 1 | 40 | | | 60 | | 100 | 0 | APB-BMI | 20 | insulation | present | ≧1 kN/m | Nothing abnormal detected |
| Comparative Example 2 | 0 | | | 100 | | 100 | 0 | APB-BMI | 20 | insulation | present | ≧1 kN/m | Nothing abnormal detected |
| Comparative Example 3 | 40 | | | 60 | | 100 | 0 | — | 0 | insulation | present | <1 kN/m | Blister |
| Comparative Example 4 | 0 | | | 100 | | 100 | 0 | — | 0 | insulation | present | <1 kN/m | Blister |
| Comparative Example 5 | Synthesis Example 1 | | | | | Synthesis Example 2 | | BMI-80 | 30 | insulation | present | ≧1 kN/m | Blister |
| Comparative Example 6 | Synthesis Example 1 | | | | | | | BMI-80 | 30 | insulation | present | ≧1 kN/m | Blister |

(4)

In Examples 1 to 19 and Comparative Examples 1 to 4, the molar ratio of the total acid anhydride to the total diamine components: 0.975

According to the present invention as described above, for a polyimide type adhesive in a resin metal laminate plate, it is possible to provide a resin composition which is excellent in low-temperature adhesive property, resistance to soldering heat and high adhesion, and in which a smear is easily removed in a desmear process by a permanganate aqueous solution or the like, and a metal resin laminate plate using the resin.

That is, when the resin composition according to the present invention is used for a metal laminate plate by using a specific acid dianhydride represented by the Formula (1), a diamine component containing a specific diamine compound represented by the Formula (2) and a specific bismaleimide compound represented by the Formula (3) as raw materials, it is possible to accomplish a resin composition which can be used as a polyimide type adhesive excellent in low-temperature adhesive property, resistance to soldering heat and high adhesion, and in which a smear is easily removed in a desmear process by a permanganate aqueous solution or the like, and a metal resin laminate plate using the resin.

The present invention is specified by the following matters.

(1) A resin composition comprising a polyimide resin composition or precursor thereof obtained from an acid dianhydride component containing a compound represented by the following Formula (1) and a diamine component containing a diamine compound represented by the following Formula (2), and a bismaleimide compound, represented by the following Formula (3), wherein the diamine component contains a diamine compound (a) in which m in the Formula (2) represents an integer of 0 or 1 and a diamine component (b) in which m in the Formula (2) represents an integer of 2 to 6 in the molar ratio (a:b) of from 100:0 to 50:50,

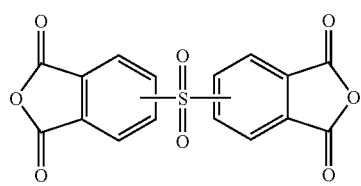

Formula (1)

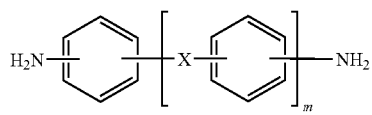

Formula (2)

wherein, in the Formula (2), when m is 2 or more, each X may be independently the same or different, and represents O, $SO_2$, S, CO, $CH_2$, $C(CH_3)_2$, $C(CF_3)_2$ or a direct bond,

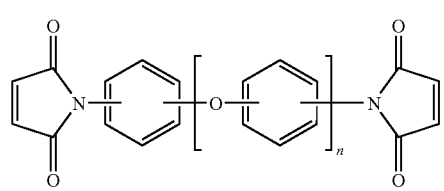

Formula (3)

wherein, in the Formula (3), n represents an integer of 0 to 6;

(2) The resin composition according to (1), wherein the bismaleimide compound represented by the aforementioned Formula (3) is contained in an amount of from 1 to 80% by mass in the resin composition;

(3) The resin composition according to (1), wherein in the diamine compound (a) represented by the Formula (2), X represents an oxygen atom;

(4) The resin composition according to (1), wherein in the diamine compound (b) represented by the Formula (2), X represents an oxygen atom;

(5) The resin composition according to (1), wherein the molar ratio (a:b) of the diamine compound (a) to the diamine compound (b) is from 100:0 to 60:40; and (6) A metal laminate plate comprising a metal layer and a resin layer, wherein the metal laminate plate comprises at least one layer of the aforementioned resin layer obtained from the resin composition as described in any one of (1) to (5).

INDUSTRIAL APPLICABILITY

A resin with a specific acid dianhydride and a specific bismaleimide compound as raw materials is excellent in adhesive strength to metals, low-temperature adhesive property, resistance to soldering heat and via processability, and is widely applied to flexible printed circuits or the like.

The invention claimed is:

1. A resin composition comprising a polyimide resin composition or precursor thereof obtained from an acid dianhydride component containing a compound represented by the following Formula (1) and a diamine component containing a diamine compound represented by the following Formula (2), and a bismaleimide compound represented by the following Formula (3), wherein the diamine component contains a diamine compound (a) in which m in the Formula (2) represents an integer of 0 or 1 and a diamine omponent (b) in which m in the Formula (2) represents an integer of 2 to 6 in a molar ratio (a:b) of from 100:0 to 50:50,

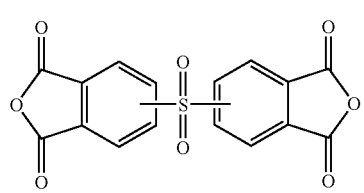

Formula (1)

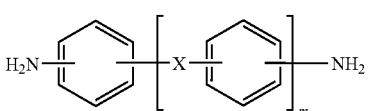

Formula (2)

wherein, in the Formula (2), when m is 2 or more, each X may be independently the same or different, and represents O, $SO_2$, S, CO, $CH_2$, $C(CH_3)_2$, $C(CF_3)_2$ or a direct bond,

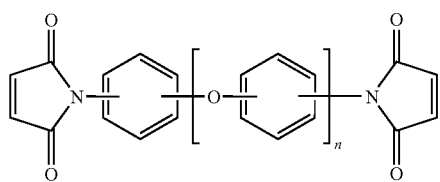

Formula (3)

wherein, in the Formula (3), n represents an integer of 2 to 6, and wherein each position of the ether bond between the aromatic rings is a meta position.

2. The resin composition according to claim 1, wherein the bismaleimide compound represented by the Formula (3) is contained in an amount of from 1 to 80% by mass in the resin composition.

3. The resin composition according to claim 1, wherein in the diamine compound (a) represented by the Formula (2), X represents an oxygen atom.

4. The resin composition according to claim 1, wherein in the diamine compound (b) represented by the Formula (2), X represents an oxygen atom.

5. The resin composition according to claim 1, wherein the molar ratio (a:b) of the diamine compound (a) to the diamine compound (b) is from 100:0 to 60:40.

6. A metal laminate plate comprising a metal layer and a resin layer, wherein the metal laminate plate comprises at least one layer of the resin layer obtained from the resin composition of claim 1.

* * * * *